US006989685B1

(12) United States Patent
Andersen et al.

(10) Patent No.: US 6,989,685 B1
(45) Date of Patent: Jan. 24, 2006

(54) METHOD AND SYSTEM FOR MAINTAINING UNIFORM MODULE JUNCTION TEMPERATURE DURING BURN-IN

(75) Inventors: Kevin C. Andersen, Williston, VT (US); John A. Fifield, Underhill, VT (US); Harold Pilo, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/711,040

(22) Filed: Aug. 19, 2004

(51) Int. Cl.
*G01R 31/26* (2006.01)

(52) U.S. Cl. ....................... 324/765; 324/760; 324/763

(58) Field of Classification Search ..................... None
See application file for complete search history.

(56) References Cited

U.S. PATENT DOCUMENTS 4,329,597 A 5/1982 Yamagiwa .................. 307/455
4,924,112 A 5/1990 Anderson et al. ........... 307/270
5,233,161 A 8/1993 Farwell et al. ............. 219/209
5,327,075 A 7/1994 Hashinaga et al. ...... 324/158.1
5,406,212 A 4/1995 Hashinaga et al. ......... 324/760
5,557,550 A 9/1996 Vigil et al. ................. 364/557
6,163,161 A 12/2000 Neeb .......................... 324/760
6,608,291 B1 * 8/2003 Collins et al. .............. 219/662
6,678,513 B2 1/2004 Glasbrener et al. ......... 455/341

FOREIGN PATENT DOCUMENTS

JP 2000260578 A 9/2000

OTHER PUBLICATIONS

"What is burn-in?" found at http://www.burn-in.com/primer.htlm, (no month, year).
A.J. Abrami, R.C. Chu, D. L. Edwards, M.J. Ellsworth, S.R. Quigley and R.E. Simons; "TCM Thermal Reticle;" Research Disclosure, Feb. 1991, No. 322.

* cited by examiner

*Primary Examiner*—Minh N. Tang
(74) *Attorney, Agent, or Firm*—Robert A. Walsh; Cantor Colburn LLP

(57) ABSTRACT

A method for controlling the burn-in temperature of a semiconductor chip includes determining a DC current of the chip, and determining a difference between the DC current and a target current, the target current being selected to produce a desired chip temperature. An operating frequency of the chip is calculated, based on the determined difference between the DC current and the target current, so as generate an additional AC component of current to attain the target current.

19 Claims, 4 Drawing Sheets

METHOD AND SYSTEM FOR MAINTAINING UNIFORM MODULE JUNCTION TEMPERATURE DURING BURN-IN

BACKGROUND OF INVENTION

The present invention relates generally to integrated circuit devices and, more particularly, to a method and system for maintaining uniform module junction temperature during burn-in.

Integrated circuits exhibit most failures during early life and at the end of their useful life, and thus tend to be the most reliable between those two periods. Many, if not most, integrated circuit early life failures can be accelerated by increased temperature. Accordingly, integrated circuits utilized in high reliability systems are subjected to burn-in testing by semiconductor manufacturers or independent test labs wherein an integrated circuit is placed in a burn-in oven that produces an in-oven ambient temperature intended to achieve a desired chip junction temperature. Typically, during burn-in testing, the integrated circuit under test is also powered (i.e., power is applied to the supply pins of the integrated circuit). This is also referred to as static burn-in testing. If the integrated circuit is further being operated as intended during the burn-in, then such testing is referred to as dynamic burn-in testing.

In any case, one important consideration with respect to conventional burn-in testing relates to the precise control of the burn-in temperature through control of the oven ambient temperature. More specifically, maintaining a specified chip junction temperature is very difficult due to the lack of knowledge of the specific characteristics of the thermal environment (e.g., ambient-to-package heat transfer and case-to-junction heat transfer), as well as lack of knowledge of the precise chip power dissipation during the burn-in process. Thus, conventional burn-in testing can result in under-screening using temperatures that are too low, or in overstress of the integrated circuit using temperatures that are too high.

Furthermore, variations in the voltage and temperature acceleration of the IC devices may also lead to inadequate stress levels and therefore early-life failures for the target integrated circuit application. Devices that are burned-in at varying voltages and temperatures may not see sufficient stress levels, which can lead to early-life failures in the target application. Accordingly, the burn-in board (BIB) design should ensure that both the voltage supply and temperature levels are met at all of the module locations. However, providing a consistent junction temperature in high thermally resistive packages, such as wire-bond ball grid arrays (BGA) becomes increasingly difficult given that device scaling reduces the active power but increases the standby component of the power and increases the variation across the process window.

For example, an FBGA wire-bond package (having a junction-to-case thermal resistance of about 20° C./W) used in conjunction with an SRAM device having a maximum operating burn-in power of 1 watt will require that the burn-in oven temperature be set at 120° C. to establish a desired junction temperature of 140° C. However, if the operating power of the SRAM varies from 0.2 W to 2.0 W, then the oven set temperature of 120° C. would result in corresponding (and undesirable) junction temperature variations from 124° C. to 160° C.

Accordingly, it would be desirable to be able to maintain a near-constant power characteristic across process variations and to reduce module junction temperature variations during burn-in testing.

SUMMARY OF INVENTION

The foregoing discussed drawbacks and deficiencies of the prior art are overcome or alleviated by a method for controlling the burn-in temperature of a semiconductor chip under test. In an exemplary embodiment, the method includes determining a DC current of the chip, and determining a difference between the DC current and a target current, the target current being selected to produce a desired chip temperature. An operating frequency of the chip is calculated, based on the determined difference between the DC current and the target current, so as generate an additional AC component of current to attain the target current.

In another embodiment, a system for controlling the burn-in temperature of a semiconductor chip under test includes a processing device on the chip for determining a difference between a DC current of the chip and a target current, the target current selected to produce a desired chip temperature. The processing device is further configured for calculating an operating frequency of the chip, based on the determined difference between the DC current and the target current, so as generate an additional AC component of current to attain the target current.

BRIEF DESCRIPTION OF DRAWINGS

Referring to the exemplary drawings wherein like elements are numbered alike in the several Figures.

DETAILED DESCRIPTION

Disclosed herein is a method and system for maintaining uniform module junction temperature during burn-in, in which the DC (e.g., leakage) current component of a given chip is supplemented with a corresponding AC current component in order to result in a target current for each chip. Because chip temperature is related to chip current consumption, the establishment of a uniform chip current value results in a reduction of module junction temperature variation during burn-in testing, thereby improving the burn-in acceleration and reliability of the device.

Figure 1:
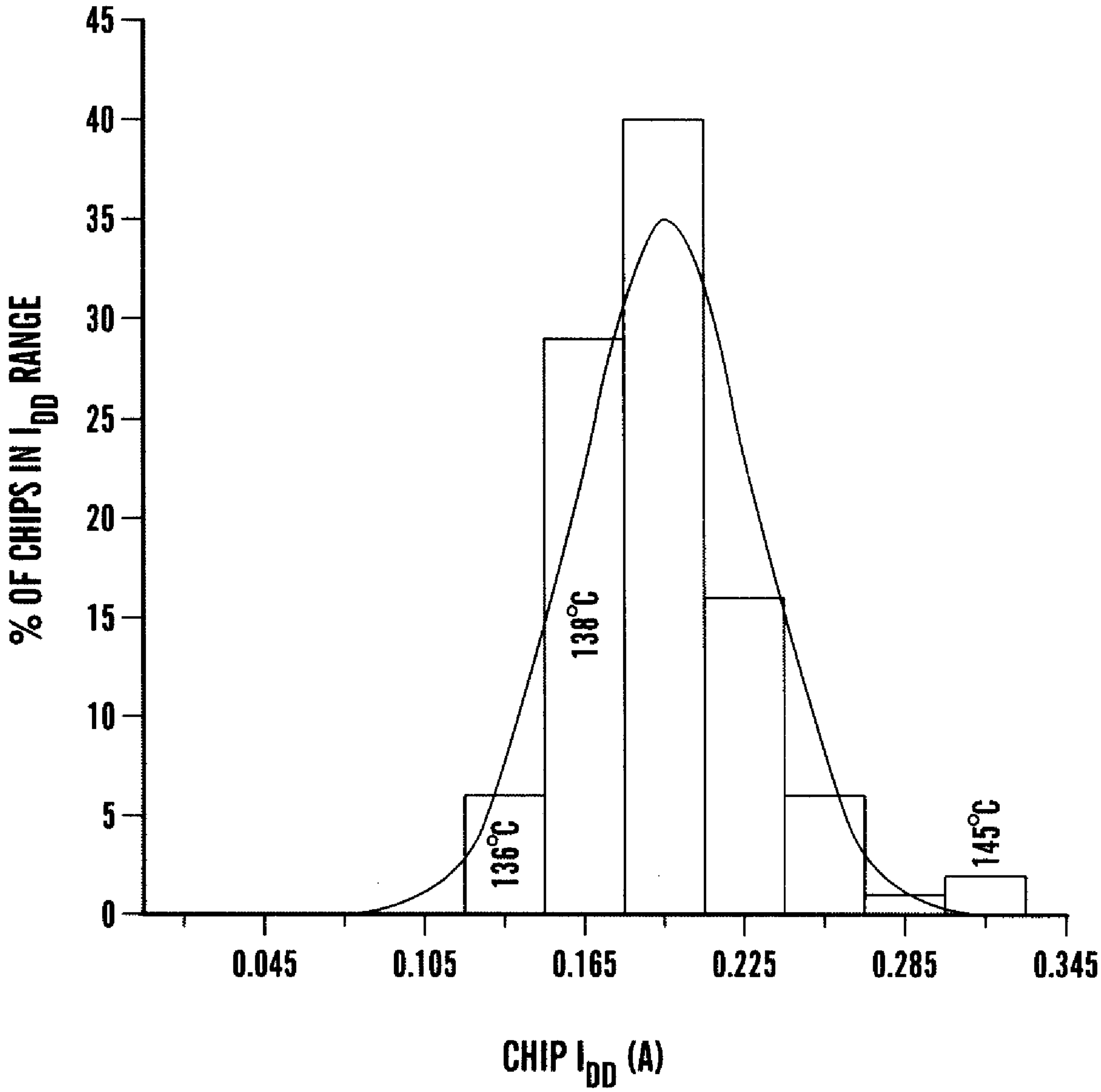
FIG. 1 is a graph illustrating an exemplary statistical distribution of DC leakage current ranges for a sample of chips formed on a given wafer.

Referring initially to FIG. 1, there is shown a graph illustrating an exemplary statistical distribution of DC leakage current ($I_{DD}$) ranges for a sample of chips formed on a given wafer. As is shown, the $I_{DD}$ of the various chips varies from about 135 milliamps (mA) to about 315 mA. In addition, the graph illustrates estimated junction temperatures of certain chips assuming a burn-in temperature of 130° C. and a thermal resistance, $\Theta_{JC}$, of 20° C./W. It will be noted that as a result in variation of $I_{DD}$, there is a corresponding variation in junction temperature for the different chips. For example, as shown, those chips for which $I_{DD}$ is in the range of about 135 mA have a junction temperature of about 136° C., while those chips for which $I_{DD}$ is in the range of about 315 mA have a junction temperature of about 145° C. Moreover, the $I_{DD}$ variations of the example depicted in FIG. 1 are fairly conservative with respect to SRAM devices fabricated according to a similar technology.

Figure 2:
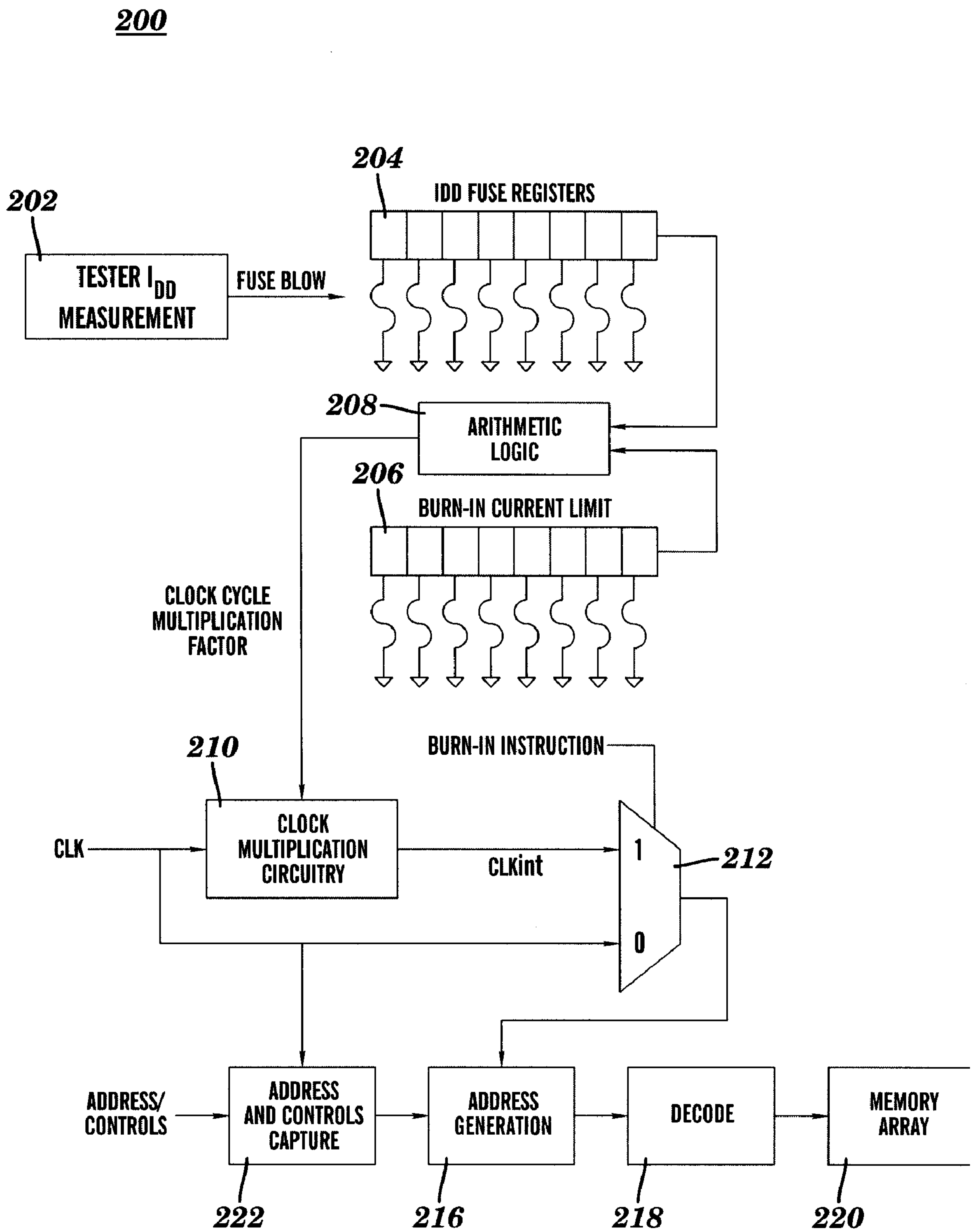
FIG. 2 is a schematic block diagram of a method for maintaining uniform module junction temperature during burn-in, in accordance with an embodiment of the invention.

Therefore, in accordance with an embodiment of the invention, FIG. 2 is a schematic block diagram of a method 200 for maintaining uniform module junction temperature during burn-in. For each manufactured chip subjected to a burn-in process, an individual DC leakage current ($I_{DD}$) measurement is obtained, as shown in block 202, and encoded onto the current chip prior to the actual burn-in testing. In the embodiment depicted, the tested $I_{DD}$ measurement is coded into a fuse register 204 that is programmed by blowing individual fuses associated therewith. Also encoded onto each chip is a predetermined upper burn-in current limit, which may also be coded into register 206 by blowing individual fuses associated therewith.

The burn-in current limit is used as a target current value at which each chip is to be operated during burn-in testing. Thus, in order to reach the target current, a specific amount of additional AC operating current is calculated such that the total of the AC operating current and the DC leakage current ($I_{DD}$) is equal to the target current (i.e., the burn-in current limit). It should be first noted that those chips for which the measured $I_{DD}$ exceeds the burn-in current limit are discarded as defective. Accordingly, an arithmetic logic unit (ALU) 208 is used to compare the difference between the measured $I_{DD}$ for a given chip and the burn-in current limit ($I_{Burnin}$) to see how much additional current is needed to achieve the target current, and thus provide a uniform junction temperature from chip to chip.

The additional amount of AC current is realized by utilizing clock multiplication circuitry 210 that will multiply the frequency of circuit operations with respect to a nominal external clock signal (CLK), thereby increasing the amount of current consumed. As is further shown in FIG. 2, the output of the ALU 208 represents a number by which the external clock frequency is to be multiplied. This multiplication factor is in turn dependent upon the cycle time of the external clock signal (CLK), the difference between the target current ($I_{Burnin}$) and the measured DC leakage current (I DD), the internal chip capacitance, and the chip operating voltage ($V_{DD}$).

Alternatively, the multiplication factor could be calculated at the time of the initial chip test and directly encoded/stored on the chip itself. In other words, a hard-coded multiplication factor could be used as a direct input to clock multiplication circuitry 210. This would then obviate the need for ALU 208 and fuse registers 204, 206 for the specific purpose of comparing stored values of DC current and target current in order to compute the desired multiplication factor.

Regardless of whether the multiplication factor is computed on-chip or off-chip, a multiplexer 212 or other suitable selection device is used to select either the nominal external clock signal or the multiplied internal clock signal (CLKint) generated by clock multiplication circuitry 210 for controlling the chip operating devices. In the specific memory module example depicted, the multiplied internal clock signal CLKint (when selected by multiplexer 212) is used to control address generation circuitry 214 of the chip, which increases the frequency of operations (e.g., read operations) of the decode circuitry 218 and array circuitry 220. However, the address and controls capture circuitry 222 is still controlled by the external clock signal CLK.

Figure 3:
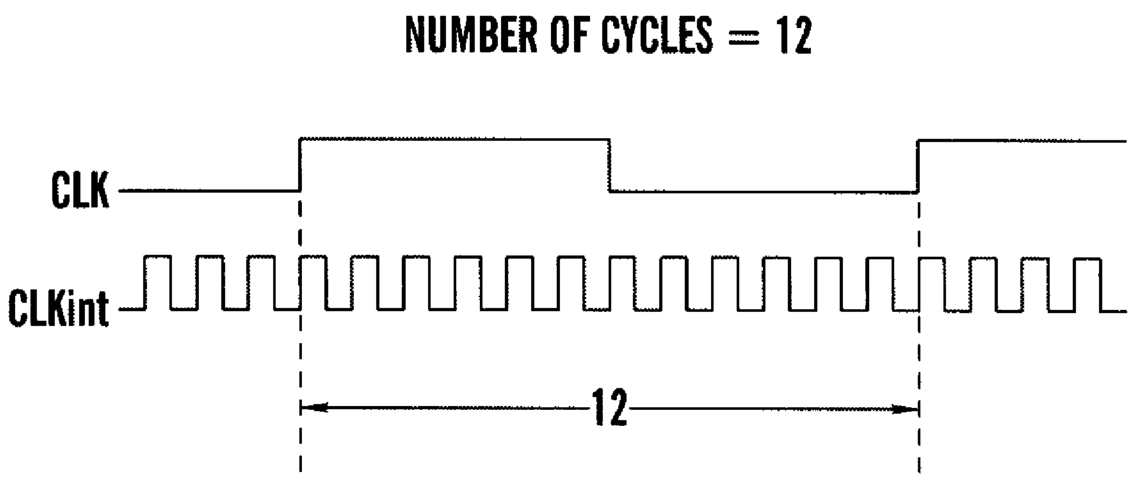
FIG. 3 illustrates an example of the generation of the internal clock signal used to adjust the AC operating current of a chip in order to achieve to the target burn-in current.

FIG. 3 illustrates an example of the generation of the internal clock signal CLKint when the ALU 208 determines that a cycle multiplication factor of 12 is needed to adjust the AC operating current of the chip such that, when combined with the DC leakage current, the target burn-in current is achieved. As can be seen, for each cycle of the external clock, there are 12 internal clock cycles generated to increase the AC current of the chip. As clock multiplication circuitry is well known in the art, the details of such are not discussed in further detail herein. However, the manner in which the clock cycle multiple calculation is carried out by the ALU 208 may be implemented in accordance with the following:

$$\#\text{ of Cycles}=\text{Cycle}_{Burnin}\cdot(I_{Burnin}-I_{DD})/(C\cdot V_{DD}) \qquad \text{(eq. 1)}$$

wherein $\text{Cycle}_{Burnin}$ is the period of the external clock, $I_{Burnin}$ is the target current, $I_{DD}$ is the measured DC leakage current, C is the internal chip capacitance, and $V_{DD}$ is the chip operating voltage. The internal chip capacitance is derived from the characterization of the AC component of the active current, and has small variations across the process window. By way of example, for a target burn-in current of 400 mA, an operating voltage of 2.3 volts and a junction thermal resistance of 20° C./W, the resulting junction temperature increase is:

$$(0.4\text{ A}\cdot 2.3\text{ V})\cdot 20°\text{ C./W}=18°\text{ C.}$$

Thus, if the desired burn-in temperature is 140° C., an oven temperature of 122° C. is used in conjunction with the target burn-in current.

Accordingly, using the above example, if the measured DC leakage current of a chip is 100 mA, and if the operating capacitance of the chip is 2.7 nF (e.g., for an eDRAM device), then the number of cycles is:

$$400\text{ ns}\cdot(400\text{ mA}-100\text{ mA})/(2.7\text{ nF}\cdot 2.3\text{ V})=19.$$

Figure 4:
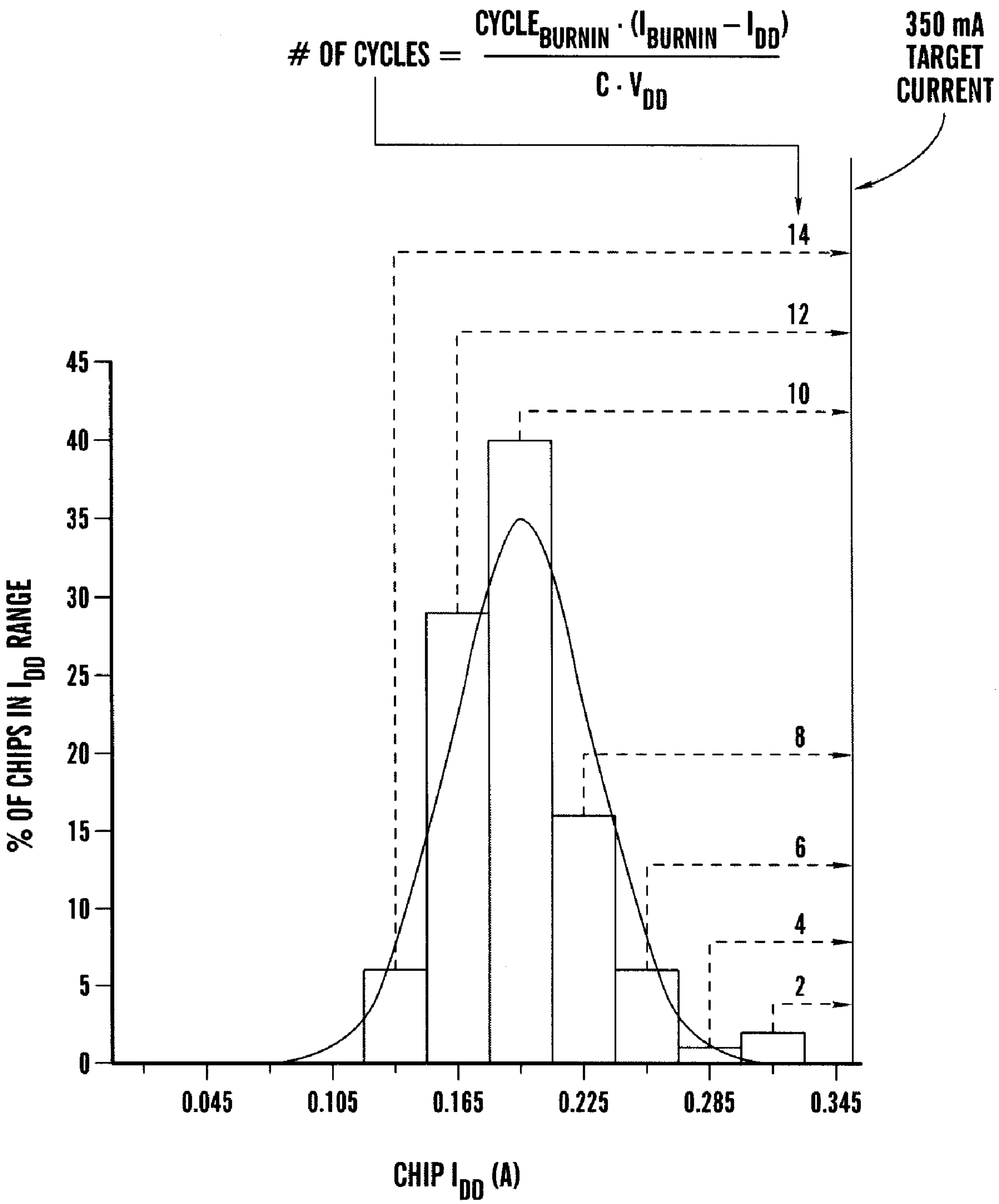
FIG. 4 re-illustrates the statistical distribution of DC leakage current ranges for the sample of chips, with a further designation of the cycle multiplication factor needed to provide a uniform target burn-in current of about 350 mA.

Finally, FIG. 4 re-illustrates the statistical distribution of DC leakage current ranges for the sample of chips, with a further designation of the cycle multiplication factor needed to provide a uniform target burn-in current of about 350 mA. As is shown, the higher the DC leakage current, the less AC current is needed to reach the target current, and thus the lower the multiplication factor. In general, for the example illustrated, every additional 0.032 mA of AC current needed corresponds to an additional cycle multiplication factor of 2.

As will be appreciated, the above described system and method provides a predetermined chip temperature for an efficient burn-in operation. By relating chip temperature to chip current consumption, the DC leakage current of a given chip can be augmented with a calculated amount of AC current to reach a target burn-in current. Each chip has its intrinsic DC leakage current measured, wherein a code corresponding to the measured level is fused into an on-chip register. Then, an on-chip comparator circuit is used to calculate the number of cycles needed to create additional heating and bring the chip up to the desired burn-in temperature.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for controlling the burn-in temperature of a semiconductor chip, the method comprising:

determining a DC current of the chip;

determining a difference between said determined DC current and a target current, said target current selected to produce a desired chip temperature; and calculating an operating frequency of the chip, based on said determined difference between said DC current and said target current, so as generate an additional AC component of current to attain said target current.

2. The method of claim 1, wherein said DC current is a leakage current of the chip.

3. The method of claim 2, further comprising measuring said DC leakage current of the chip and recording the measured value on the chip.

4. The method of claim 3, wherein said DC leakage current is encoded within on-chip fuse registers.

5. The method of claim 4, wherein said target current is also encoded within on-chip fuse registers.

6. The method of claim 2, wherein said calculated operating frequency is implemented through clock multiplication circuitry included within the chip.

7. The method of claim 2, wherein said calculating an operating frequency further comprises multiplying an external clock signal by a multiplication factor, said multiple based on a cycle time of said external clock signal, said determined difference between said DC leakage current and said target current, an internal chip capacitance, and a chip operating voltage.

8. The method of claim 7, wherein said multiplication factor is determined in accordance with the following expression:

$$Cycle_{Burnin}\cdot(I_{Burnin}-I_{DD})/(C\cdot V_{DD});$$

wherein $Cycle_{Burnin}$ is said cycle time of said external clock signal, $I_{Burnin}$ is said target current, $I_{DD}$ is said measured DC leakage current, C is said internal chip capacitance, and $V_{DD}$ is said chip operating voltage.

9. The method of claim 8, further comprising:

generating an internal clock signal by multiplying said external clock signal by said multiplication factor; and selectively switching between said external clock signal and said internal clock signal as an input clock signal to devices on the chip, depending on whether the chip is in a burn-in mode.

10. The method of claim 8, wherein said multiplication factor is encoded on the chip.

11. A system for controlling the burn-in temperature of a semiconductor chip, comprising:

a processing device on the chip for determining a difference between a DC current of the chip and a target current, said target current selected to produce a desired chip temperature; and said processing device further configured for calculating an operating frequency of the chip, based on said determined difference between said DC current and said target current, so as generate an additional AC component of current to attain said target current.

12. The system of claim 11, wherein said DC current is a leakage current of the chip.

13. The system of claim 12, wherein said DC leakage current is encoded within on-chip fuse registers.

14. The system of claim 12, wherein said calculated operating frequency is further implemented through clock multiplication circuitry included within the chip.

15. The system of claim 14, wherein said operating frequency is calculated by multiplying an external clock signal by a multiplication factor, said multiplication factor based on a cycle time of said external clock signal, said determined difference between said DC leakage current and said target current, an internal chip capacitance, and a chip operating voltage.

16. The system of claim 15, wherein said multiplication factor is determined in accordance with the following expression:

$$Cycle_{Burnin}\cdot(I_{Burnin}-I_{DD})/(C\cdot V_{DD});$$

wherein $Cycle_{Burnin}$ is said cycle time of said external clock signal, $I_{Burnin}$ is said target current, $I_{DD}$ is said measured DC leakage current, C is said internal chip capacitance, and $V_{DD}$ is said chip operating voltage.

17. The system of claim 16, further comprising:

an internal clock signal generated by said clock multiplication circuitry; and a switching device for selectively switching between said external clock signal and said internal clock signal as an input clock signal to devices on the chip, depending on whether the chip is in a burn-in mode.

18. The system of claim 16, wherein said multiplication factor is encoded on the chip.

19. The system of claim 14, wherein said target current is also encoded within on-chip fuse registers.

* * * * *